United States Patent
Lee et al.

(10) Patent No.: US 7,528,638 B2
(45) Date of Patent: May 5, 2009

(54) CLOCK SIGNAL DISTRIBUTION WITH REDUCED PARASITIC LOADING EFFECTS

(75) Inventors: Seong-hoon Lee, Boise, ID (US); Feng Lin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/744,206

(22) Filed: Dec. 22, 2003

(65) Prior Publication Data

US 2005/0134337 A1 Jun. 23, 2005

(51) Int. Cl.
H03L 7/06 (2006.01)

(52) U.S. Cl. .................. 327/158; 327/155; 327/154; 331/25

(58) Field of Classification Search ......... 327/146–150, 327/153, 154–161; 331/14, 17, 25
See application file for complete search history.

(56) References Cited

U.S. PATENT DOCUMENTS

| | | | |
|---|---|---|---|
| 5,463,337 A * | 10/1995 | Leonowich | 327/158 |
| 5,696,950 A | 12/1997 | Ichinose et al. | 395/556 |
| 5,712,883 A | 1/1998 | Miller et al. | 375/371 |
| 5,751,665 A * | 5/1998 | Tanoi | 368/120 |
| 5,850,157 A | 12/1998 | Zhu et al. | 327/295 |
| 5,939,919 A | 8/1999 | Proebsting | 327/295 |
| 6,016,082 A | 1/2000 | Cruz et al. | 331/117 |
| 6,072,348 A | 6/2000 | New et al. | 327/295 |
| 6,111,448 A | 8/2000 | Shibayama | 327/293 |
| 6,194,916 B1 * | 2/2001 | Nishimura et al. | 327/12 |
| 6,194,932 B1 * | 2/2001 | Takemae et al. | 327/158 |
| 6,252,449 B1 | 6/2001 | Hanriat | 327/295 |
| 6,294,938 B1 * | 9/2001 | Coddington et al. | 327/158 |
| 6,373,913 B1 * | 4/2002 | Lee | 375/376 |
| 6,396,323 B1 * | 5/2002 | Mizuno | 327/295 |
| 6,446,180 B2 * | 9/2002 | Li et al. | 711/167 |
| 6,456,676 B1 | 9/2002 | O'Connor et al. | 375/354 |
| 6,483,388 B2 * | 11/2002 | Khan | 331/18 |
| 6,526,374 B1 * | 2/2003 | Martin | 703/14 |
| 6,552,955 B1 * | 4/2003 | Miki | 365/233 |
| 6,605,969 B2 * | 8/2003 | Mikhalev et al. | 327/158 |
| 6,657,460 B2 * | 12/2003 | Tang | 326/86 |
| 7,196,559 B2 * | 3/2007 | Chien | 327/115 |
| 7,274,231 B1 * | 9/2007 | Gillespie et al. | 327/158 |
| 2002/0060594 A1 | 5/2002 | Stasiak et al. | 327/295 |

\* cited by examiner

*Primary Examiner*—An T Luu
(74) *Attorney, Agent, or Firm*—Ropes & Gray LLP; Jeffrey H. Ingerman; Chia-Hao La (57) ABSTRACT

Clock signal distribution systems with reduced parasitic loading effects are provided. A reference clock is frequency-divided to produce a lower frequency clock signal. A delay-locked loop (DLL) circuit locks to the lower frequency clock signal, and outputs a corresponding lower frequency clock signal for distribution over a long trace. Power consumption caused by parasitic capacitance of the trace is thereby reduced. Parasitic effects associated with clock jitter are also reduced. A frequency multiplying phase-locked loop (PLL) circuit locks to the lower frequency clock signal, and outputs at least one clock signal having a higher frequency than the lower frequency signal.

25 Claims, 5 Drawing Sheets

CLOCK SIGNAL DISTRIBUTION WITH REDUCED PARASITIC LOADING EFFECTS

BACKGROUND OF THE INVENTION

This invention relates to clock signal distribution systems. More particularly, this invention relates to clock signal distribution systems with reduced parasitic loading effects.

System clock signals are typically remotely generated for distribution to various digital circuit subsystems. The system clock generator and the digital subsystems may be located in geographically disparate regions of the digital circuit. Clock signals are distributed throughout the digital circuit over traces (i.e., device interconnects; e.g., a signal wire) having characteristic parasitic capacitances. The parasitic capacitances result in loading effects (e.g., power loss and effects associated with clock jitter) that can vary in direct proportion to both clock frequency and trace length. Technology trends indicate that the physical separation of system clock generators and associated digital sub-systems will increase as digital circuits become progressively more complex, thereby resulting in increased parasitic load. Moreover, the effects of parasitic loading in digital systems are further exacerbated by ever-increasing system clock frequency.

In view of the foregoing, it would be desirable to provide clock signal distribution systems with reduced parasitic loading effects.

SUMMARY OF THE INVENTION

It is an object of this invention to provide clock signal distribution systems with reduced parasitic loading effects.

In accordance with this invention, a clock signal distribution system is provided in which a reference clock signal is frequency-divided prior to being distributed over a long trace to one or more digital sub-systems. A frequency divider outputs a clock signal having a lower frequency than the reference clock frequency. A delay-locked loop (DLL) circuit "locks" to the lower frequency signal, and outputs a corresponding lower frequency clock signal for distribution over the trace. Power loss through the characteristic capacitive load of the trace is thereby reduced. Parasitic effects associated with clock jitter are also reduced. A frequency multiplying phase-locked loop (PLL) circuit locks to the lower frequency clock signal and outputs at least one clock signal having a higher frequency than the frequency of the lower frequency signal (e.g., outputs a signal having a frequency equal to the reference clock frequency). Multi-phase clock signals may be optionally generated by the PLL.

In some embodiments, the time required for a frequency-multiplying PLL of the invention to lock to an input signal is advantageously reduced. A frequency-multiplying PLL having voltage-controlled delay units (VCDs) is initialized with the control voltage of a DLL having substantially identical VCDs. In general, DLLs have characteristically faster lock times than do PLLs. The DLL receives the reference clock signal as input. The control voltage of the DLL is provided to the PLL, and causes the PLL to lock to a desired frequency at substantially the same time that the DLL locks. Once the PLL is locked, the control voltage that maintains the frequency lock of the PLL is locally generated by the PLL.

The invention also provides methods of distributing clock signals with reduced parasitic loading effects.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

The invention is directed to reducing parasitic loading effects in clock signal distribution systems.

Figure 1:
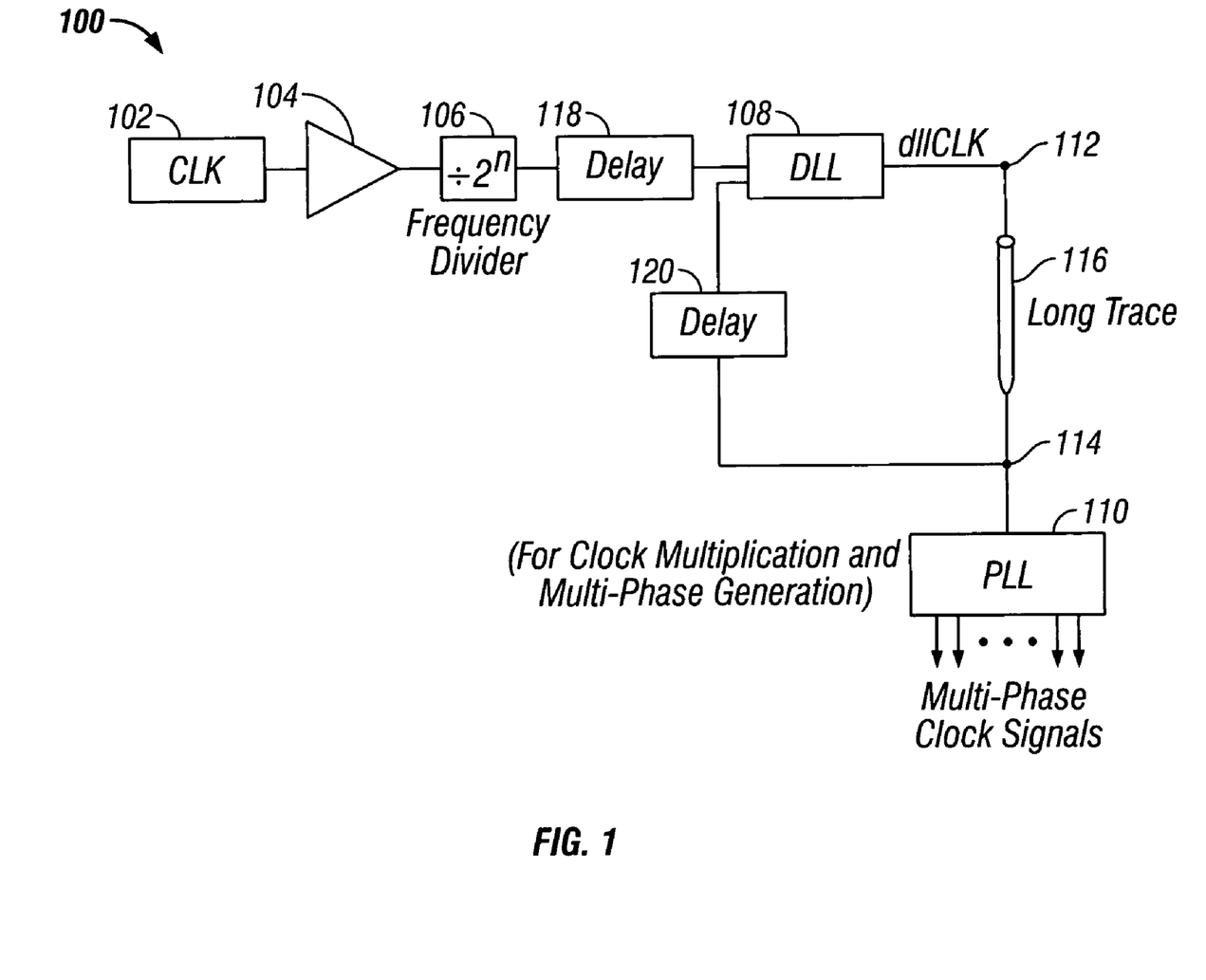
FIG. 1 is a block diagram of a clock signal distribution system in accordance with the invention.

FIG. 1 shows a clock signal distribution system 100 in accordance with the invention. System 100 includes clock generator 102, buffer 104, frequency divider 106, delay-locked loop (DLL) 108 and phase-locked loop (PLL) 110. Clock generator 102 outputs a reference clock signal having a first frequency ($f_{ref}$) to buffer 104. Frequency divider 106 receives the reference clock signal from buffer 104, and outputs to DLL 108 a second clock signal having a frequency ($f_2$) that is equal to the reference clock frequency divided by $2^n$ (i.e., $f_2=f_{ref}/2^n$) for all positive integers n. DLL 108 "locks" to the second clock signal and outputs at output 112 a third clock signal preferably having the same frequency ($f_2$) as the second clock signal. Other frequencies may of course be provided by DLL 108. "Locking" by DLL and PLL circuits is described in greater detail below in connection with FIGS. 2-4. Delay circuits 118 and 120, which relate to signal "locking" in system 100, are also described in connection with FIGS. 2-4. The third clock signal is provided to input 114 of PLL 110 over long trace 116, which is a device interconnect (e.g., a wire) having a parasitic capacitance ($C_p$). PLL 110 "locks" to the third clock signal, and then frequency multiplies this signal to generate a fourth clock signal having a frequency ($f_{out}$) that is $2^m$ times greater than the frequency ($f_2$) of the third clock signal (i.e., $f_{out}=f_2*2^m$) for all positive integers m. Variables m and n may be optionally selected to be the same such that PLL 110 outputs a clock signal having the same frequency as the reference clock signal output by clock generator 102 (i.e., such that $f_{out}=f_{ref}$).

In accordance with the invention, parasitic loading effects of clock distribution system 100 are advantageously reduced. In general, distributing a clock signal over a trace results in power loss proportional to $f*C_p$, where f is the frequency of the clock signal and $C_p$ is a parasitic capacitance characteristic of the trace. Longer traces have larger parasitic capacitances. Therefore, it follows that circuit 100, which distributes a clock signal having a frequency ($f_2$) lower than the reference clock frequency ($f_{ref}$) over trace 116, advantageously has reduced power loss relative to systems that distribute the reference clock signal over such a trace. Put another way, system 100 saves power ($P_{saved}$) by reducing the frequency of the reference clock signal before the signal is transmitted over the trace, as can be represented by the following equation:

$$P_{saved} \propto (f_{ref}-f_2)*C_p$$

Power consumption of system 100 is further reduced relative to systems that distribute the higher frequency reference clock signal over the trace because system 100 requires fewer (if any) signal repeater circuits, which consume power, along the trace to prevent excessive signal attenuation during signal transmission. Parasitic effects associated with clock jitter are also reduced in system 100 relative to systems that distribute the reference clock signal over the trace. Generally, clock jitter is an undesirable time shift of a clock signal that can result during signal transmission. For a given time shift, higher frequency signals experience larger undesirable phase shifts than do lower frequency signals.

In some electronic systems, multi-phase clock signals may be used to control digital operations. The clock signal distribution system of the invention can be used in such systems. In particular, PLL 110 can be a frequency-multiplying PLL that generates multi-phase clock signals. For example, PLL 110 may receive a clock signal having a first frequency, and output a plurality of clock signals having a higher frequency than the first frequency, the plurality of clock signals having different phases. Multi-phase clock signals may be used, for example, in electronic systems in which complex timing requirements require multi-function operations to be completed during a single clock cycle. Multi-phase clock signals may also be used in electronic systems in which a single operation extends over more than one clock cycle. PLL multi-phase clock generators for use in the clock distribution systems of the invention are further described in connection with FIG. 4.

Figure 2:
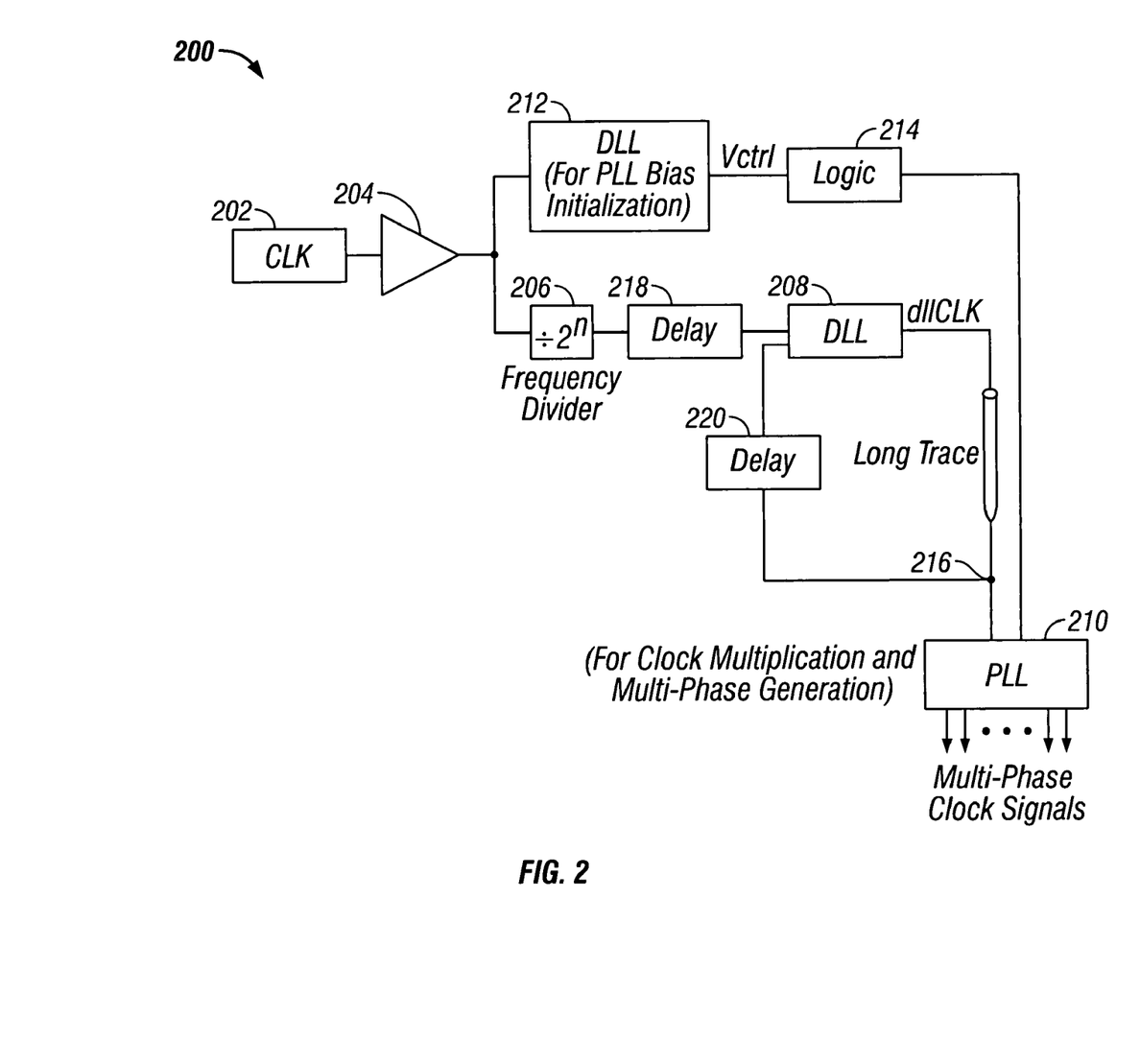
FIG. 2 is a block diagram of another embodiment of a clock signal distribution system in accordance with the invention.

FIG. 2 shows another embodiment of a clock signal distribution system in accordance with the invention. System 200 includes clock generator 202, buffer 204, frequency divider 206, delay-locked loop (DLL) 208, phase-locked loop (PLL) 210, and delay circuits 218 and 220, which may be the same as the corresponding devices of circuit 100. System 200 also includes DLL 212 and logic circuit 214. In general, circuit 200 provides an additional advantage of the invention by reducing the time required for PLL 210 to "lock" to its input clock signal. PLLs typically take longer to lock to input signals than do DLLS. This is because a PLL must determine both the phase and the frequency of the input signal before the PLL can generate a "locked" output signal. DLLs need only determine the phase of the input signal to generate a "locked" output signal (for reasons described below in connection with FIG. 3). In accordance with the invention, PLL 210 receives a control signal from is DLL 212 that allows PLL 210 to lock to the frequency of the clock signal it receives at input 216 at substantially the same time that DLL 212 locks to the reference clock signal.

Figure 3:
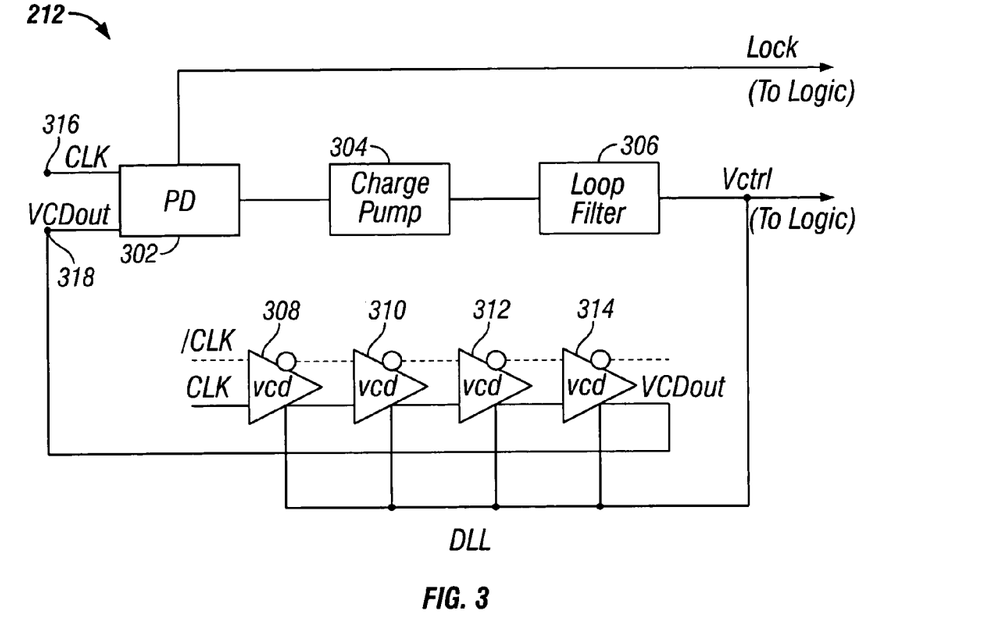
FIGS. 3 and 4 are block diagrams illustrating portions of the clock signal distribution system of FIG. 2 in accordance with the invention.

FIG. 3 shows DLL 212 of circuit 200 in accordance with the invention. DLL 212 includes phase detector 302, charge pump 304, loop filter 306 and one or more serially-coupled voltage-controlled delay units (VCDs) 308, 310, 312 and 314. In general, DLL 212 outputs a clock signal that is "locked" to both the phase and frequency of the reference clock signal received by DLL 212 from buffer 204. In particular, phase detector 302 receives the reference clock signal and a signal output from VCD 314 (i.e., the last VCD in the serially-coupled chain) at inputs 316 and 318, respectively. Because VCDs 308, 310, 312 and 314 receive the reference clock signal as input, and because VCDs do not change the frequency of their inputs, the output of VCD 314 is substantially always frequency-locked to the reference signal. Thus, DLL 212 need only determine the phase of the reference clock signal in order to allow DLL 212 to lock to the reference clock signal.

DLL 212 locks to the phase of the reference clock signal received from buffer 204 as follows: Phase detector 302 compares the phases of input signals 316 and 318, and outputs a signal indicating the result of this comparison to charge pump 304. The desired relative phase shift ($\theta_{desired}$) between the input signals is often 360° (i.e., one full reference clock period). Other phase relationships may of course be provided. Charge pump 304 adjusts the control voltage ($V_{ctrl}$) supplied to VCDs 308, 310, 312 and 314 as necessary to produce the desired phase relationship. In particular, depending on the configuration of DLL 212, charge pump 304 either increases or decreases the control voltage to decrease the phase (i.e., time delay ($tUD_{DLL}$)) of the signal output by VCD 314. Charge pump 304 either decreases or increases the control voltage to increase the phase of the signal output by VCD 314. DLL 212 is locked once the control voltage causes the following relationship to be satisfied:

$$\theta_{desired} = 360° * (N * tUD_{DLL})/t_{ref}$$

where N is the number of VCDs in the serially-coupled chain and $t_{ref}$ is the clock period of the reference clock signal input to DLL 212 (i.e., $1/f_{ref}$). If $\theta_{desired} = 360°$, it is seen that the above equation becomes $t_{ref} = N * tUD_{DLL}$, or equivalently, $f_{ref} = 1/(N * tUD_{DLL})$.

Figure 4:
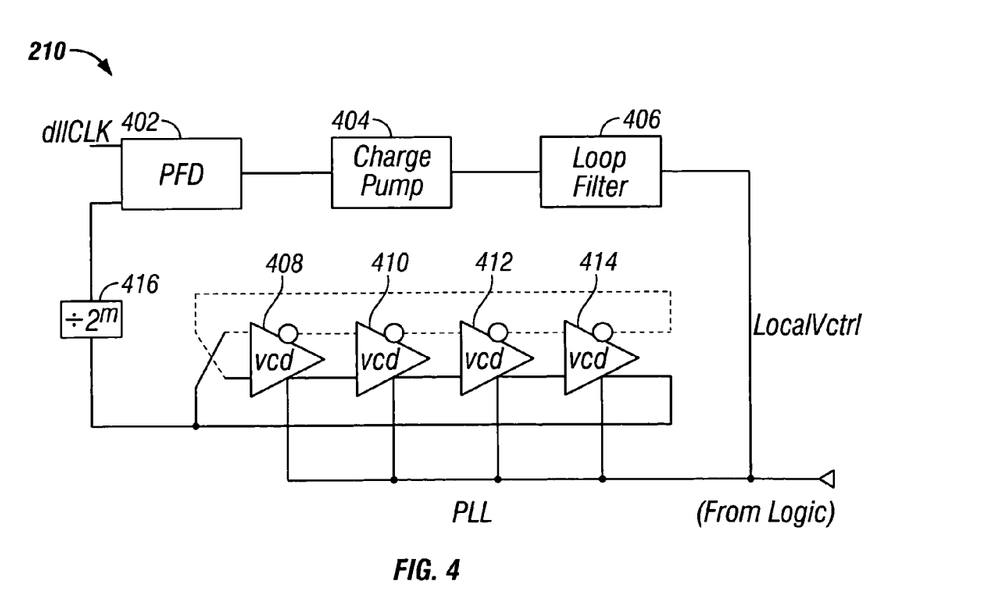

FIG. 4 shows PLL 210 of circuit 200 in accordance with the invention. PLL 210 includes phase/frequency detector 402, charge pump 404, loop filter 406, one or more serially-coupled VCDs 408, 410, 412 and 414, and frequency divider 416. Phase/frequency detector 402, charge pump 404 and loop filter 406 operate similarly to phase detector 302, charge pump 304 and loop filter 306 of DLL 212, with the exception that phase/frequency detector 402 also tracks the frequencies of its input signals. Therefore, these components of PLL 210 are not described in detail. VCDs 408, 410, 412 and 414 of PLL 210 are preferably substantially identical to the VCDs of DLL 212. However, the VCDs of PLL 210 are coupled differently than the VCDs of DLL 212. In particular, VCD 408 of PLL 210 receives two differentially coupled inputs (i.e., the inverted and noninverted outputs of VCD 414 are coupled to the noninverting and inverting inputs, respectively, of the first VCD), whereas VCD 308 of DLL 212 receives the reference clock signal and its complement signal. In other words, the VCDs of PLL 210 form a differential voltage-controlled oscillator (VCO) that generates an internal clock signal, whereas the VCDs of DLL 212 receive the reference clock signal. This accounts for the increased lock time of PLL 210 relative to DLL 212.

The voltage-controlled oscillator (VCO) of PLL 210 oscillates with a frequency $f_o = 1/(2 * N * tUD_{PLL})$, where N is the number of VCDs in the serially-coupled chain and $tUD_{PLL}$ is determined based on the control voltage supplied to the VCDS. In general, a VCO outputs N clock signals having the same frequency $f_o$, but having different phases (i.e., one output clock signal per each VCD). The phases of the N clock signals are typically equally-spaced apart relative to one another from about (360/N)° to about 360°. Various numbers of VCDs can be included in PLL 210 in order to obtain a desired phase distribution of output clock signals. For example, PLL 210 of FIG. 4 includes four VCDs (i.e., N=4) which provide four output clock signals with phases of about 90°, 180°, 270° and 360°. If eight VCDs are included in PLL 210, eight output clock signals are provided with phases of about 45°, 90°, 135°, 180°, 225°, 270° and 360°. Frequency divider 416 receives the clock signal output by VCD 414 (i.e., the last VCD in the serially-coupled chain), and outputs a clock signal to phase detector 402 having a frequency (f) equal to the VCO frequency ($f_o$) divided by $2^m$ (i.e., $f = f_o/(2^m)$) for all positive integers m. In some embodiments, m may be set equal to zero, meaning that frequency divider 416 may not be included in PLL 210. For reasons described below, m of frequency divider 416 is preferably selected to be one less than the n of frequency divider 206.

Operation of DLL 212, logic circuit 214 and PLL 210 in circuit 200 is as follows: DLL 212 receives the reference clock signal output from buffer 204. Prior to DLL 212 locking to the reference clock signal, logic circuit 214 provides a closed path between the output of loop filter 306 and the control inputs of VCDs 408, 410, 412 and 414. In other words, the control voltage of DLL 212 is provided to PLL 210 prior to DLL 212 locking to the reference clock signal (i.e., locking to both frequency and phase of the reference clock signal). As described above, the control voltage of DLL 212 preferably sets the $tUD_{DLL}$s of VCDs 308, 310, 312 and 314 such that they phase-shift the reference clock signal by 360° at the time that DLL 212 locks (i.e., such that $1/(N*tUD_{DLL})=f_{ref}$). This control voltage is also provided to PLL 212. Logic circuit 214 then "opens" the path between loop filter 306 and the control inputs of VCDs 408, 410, 412 and 414. The VCDS of PLL 210, initialized with the control voltage from DLL 212, substantially immediately begin to oscillate with a frequency of $f_o=1/(2*N*tUD_{PLL})$. Because PLL 210 and DLL 212 have substantially identical VCDs (i.e., $N*tUD_{PLL}=N*tUD_{DLL}$), it is observed that the VCO of PLL 210 substantially immediately begins to oscillate with a frequency $f_o=f_{ref}/2$. The desired condition is that the inputs to phase/frequency detector 402 are substantially immediately matching in frequency at the time DLL 212 locks (i.e., that PLL 210 is substantially immediately locked to the frequency of the signal received by phase/frequency detector 402 from DLL 208 at the time DLL 212 locks). Frequency divider 416 outputs a clock signal to phase detector 402 having a frequency ($f_{PD1}$) equal to the VCO frequency divided by $2^m$ (i.e., $f_{PD1}=(f_{ref}/2)/2^m=(f_{ref}/2^{m+1})$). As described above, the signal received by phase/frequency detector 402 from DLL 208 preferably has a frequency of $f=f_{ref}/2^n$, where n is characteristic of frequency divider 206. Thus, it is seen that the frequencies of the inputs to phase/frequency detector 402 substantially immediately match one another at the time DLL 212 locks if m of frequency divider 416 is one less than n of frequency divider 206 (i.e., m=n−1). Phase/frequency detector 402 and other circuitry of PLL 210 then locks to the phase of the signal received from DLL 208.

The signal received from DLL 208 is preferably either in-phase with the reference clock signal or phase-shifted by a predetermined phase relative to the reference clock signal. This causes the one or more clock signals output by PLL 210 to be either in-phase with or phase-shifted by a predetermined phase relative to the reference clock signal. Delay circuit 218, delay 220 and DLL 208 operate to achieve this preferred condition as follows: Delay circuit 220 feeds back to DLL, 208 the clock signal transmitted by DLL 208 to PLL 210 after the signal has been transmitted over the long trace. Delay circuit 220 may include any suitable number of delay elements (e.g., inverter circuits) in order to produce a desired time delay (i.e., phase shift). Alternatively, delay circuit 220 can be replaced by a device interconnect (e.g., a signal wire) having a characteristic time delay. Delay circuits 218 and 220 preferably do not change the frequencies of their input signals. Circuitry of DLL 208 (e.g., a phase detector, charge pump, loop filter and VDCs) adjusts the phase of the output clock signal of DLL 208 in order to match the phases of the signals input to DLL 208 from delay circuits 218 and 220. Other phase relationships may of course be provided. In one embodiment, delay circuit 218 delays the clock signal output by frequency divider 206 (which is preferably in-phase with the reference clock signal) by an amount equal to the delay produced by delay circuit 220. This causes PLL 210 to output a clock signal in-phase with the reference clock signal. In another embodiment, delay circuit 218 delays the clock signal output by frequency divider 206 by an amount having a predetermined difference relative to the delay produced by delay circuit 220. This causes PLL 210 to output a clock signal having a predetermined phase shift relative to the reference clock signal.

Logic circuit 214 may include various numbers and configurations of logic gates as needed to allow the control signal of DLL 212 to be provided to PLL 210 until DLL 212 is locked to both the frequency and phase of the reference clock signal. For example, logic circuit 214 may be a switch comprising one or more transistors (e.g., CMOS transistors) operative to close when DLL 212 is unlocked and open when DLL 212 is locked. As shown in FIG. 3, an output signal indicating whether the DLL 212 is locked may be provided to logic circuit 214 from phase detector 302. The design of a suitable logic circuit 214 should be apparent to one of ordinary skill in the art and therefore will not be further described.

Figure 5:
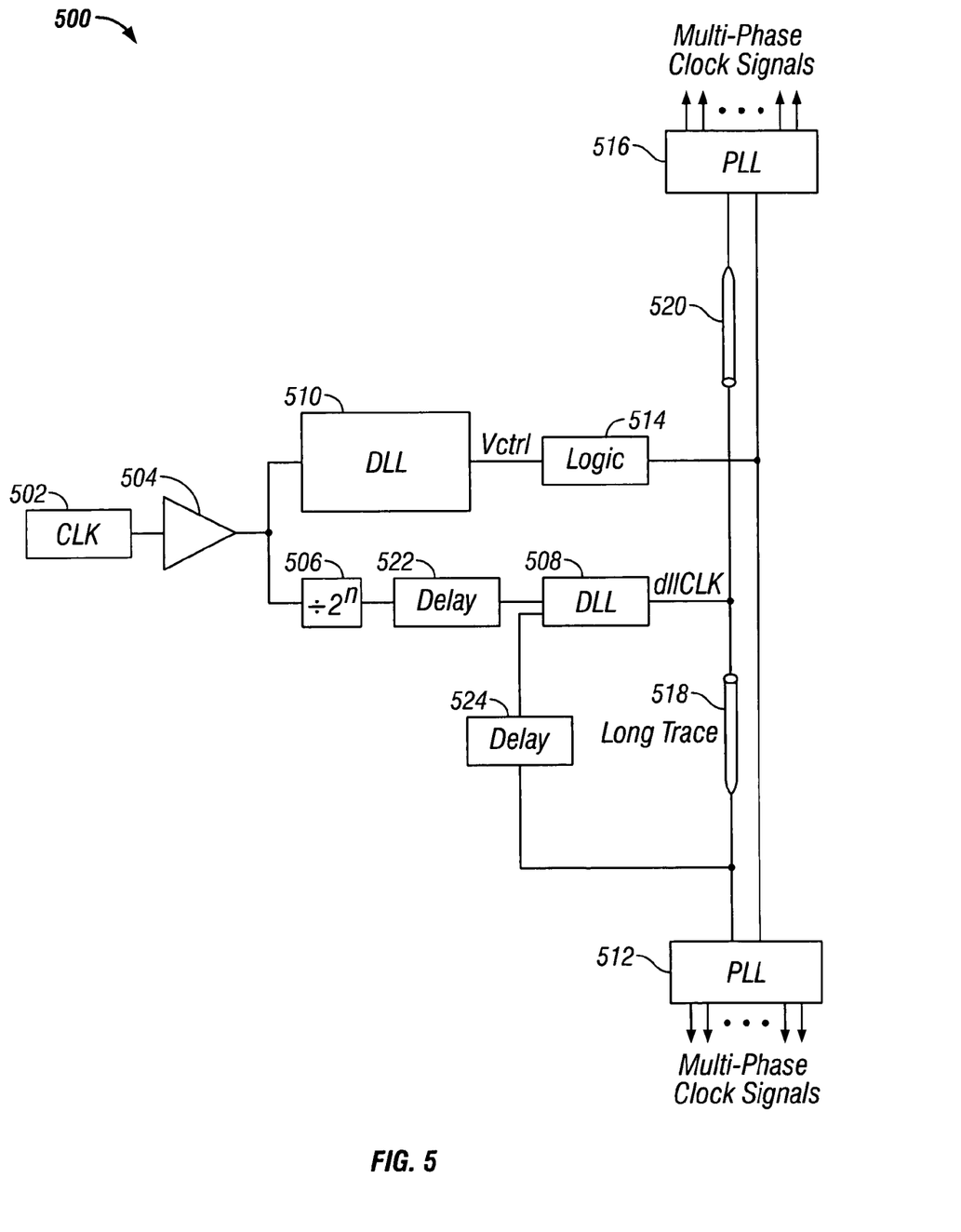
FIG. 5 is a block diagram of still another embodiment of a clock signal distribution system in accordance with the invention.

FIG. 5 shows another embodiment of a clock signal distribution system in accordance with the invention. System 500 includes clock generator 502, buffer 504, frequency divider 506, DLLs 508 and 510, PLL 512, logic circuit 514, and delay circuits 522 and 524 that may be the same as those of circuit 200. System 500 also includes an additional PLL 516 that may be the same as PLL 512. Such a system may be used, for example, in a digital circuit in which clock signals are distributed symmetrically to a plurality of subsystems over long traces 516 and 518 (e.g., distributed over substantially matching long traces 516 and 518). As shown, only one installment of DLL 508 and delay circuits 522 and 524 is needed in systems in which clock signals are distributed symmetrically to subsystems. In systems in which clock signals are distributed asymmetrically to subsystems, multiple installments of DLL 508 and delay circuits 522 and 524 may be provided (e.g., one installment per each subsystem to which signals are distributed asymmetrically). Various other numbers of PLLs such as PLLs 512 and 516 may be included in system 500 to reduce power loss and the parasitic effects of clock jitter in digital circuits that provide clock signals over corresponding numbers of long traces. Note that DLL 510 and logic circuit 514, which provide for faster locking of PLLs 512 and 516, may be optionally included in system 500.

Figure 6:
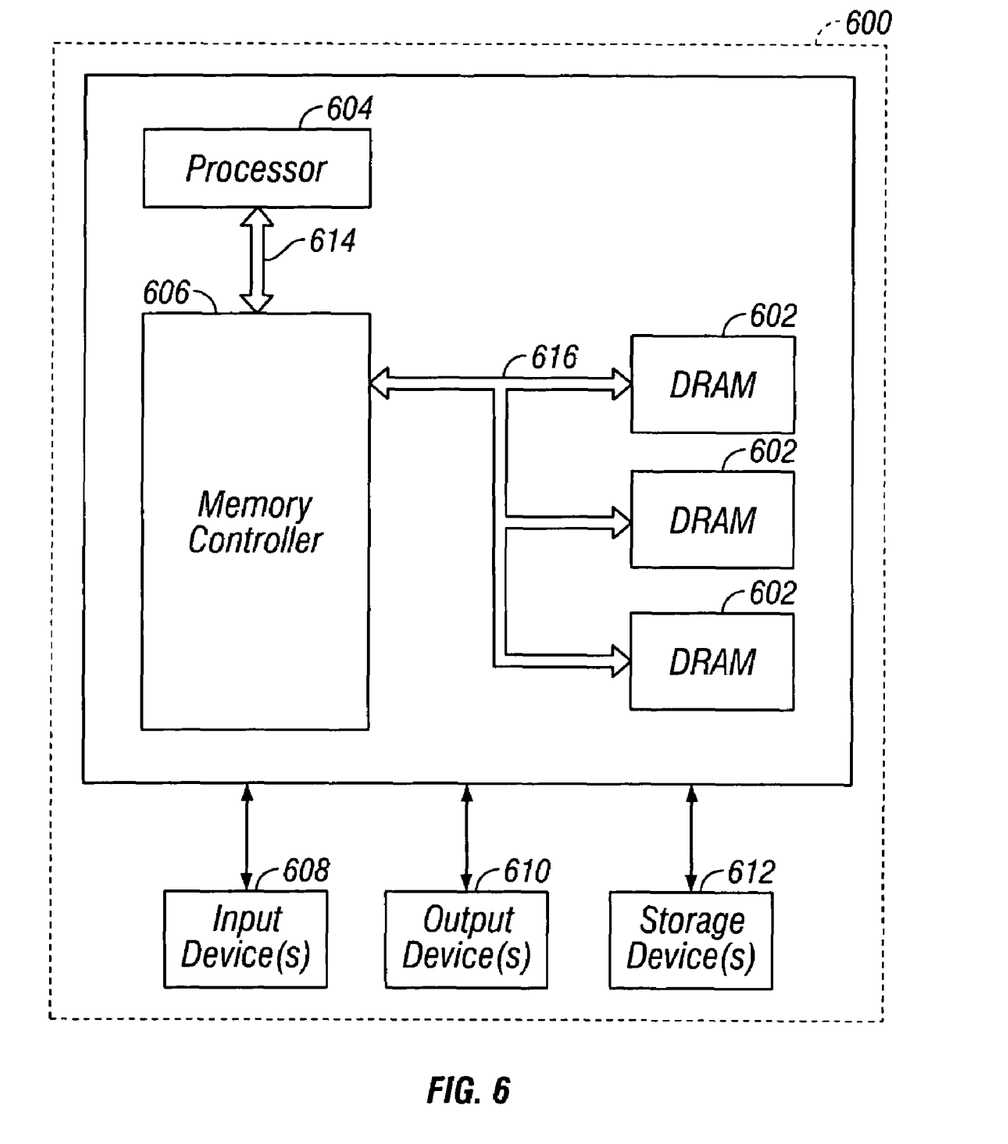
FIG. 6 is a block diagram of a system that incorporates the clock signal distribution system of the invention.

FIG. 6 shows a system 600 that incorporates the invention. System 600 includes a plurality of dynamic random access memory (DRAM) chips 602, a processor 604, a memory controller 606, input devices 608, output devices 610, and optional storage devices 612. DRAM chips 602 include an array of memory cells. One or more DRAM chips 602 also include one or more circuits of the invention to reduce power loss associated with providing clock signals over long traces. Clock signals may, for example, be distributed over traces (e.g., about 1-2 cm long) extending along the array of memory cells of DRAM chips 602. Data and control signals are transferred between processor 604 and memory controller 606 via bus 614. Similarly, data and control signals are transferred between memory controller 606 and DRAM chips 602 via bus 616. Input devices 608 can include, for example, a keyboard, a mouse, a touch-pad display screen, or any other appropriate device that allows a user to enter information into system 600. Output devices 610 can include, for example, a video display unit, a printer, or any other appropriate device capable of providing output data to a user. Note that input devices 608 and output devices 610 can alternatively be a single input/output device. Storage devices 612 can include, for example, one or more disk or tape drives.

Thus it is seen that circuits and methods for reducing power loss and the parasitic effects of clock jitter in clock distribution systems are provided. One skilled in the art will appreciate that the invention can be practiced by other than the described embodiments, which are presented for purposes of illustration and not of limitation, and the present invention is limited only by the claims which follow.

We claim:

1. A clock signal distribution circuit comprising:
   a clock generator operative to output a reference clock signal having a first frequency;
   a frequency divider operative to receive said reference clock signal and to output a second clock signal having a second frequency lower than said first frequency;
   a delay-locked loop coupled to said output of said frequency divider, said delay-locked loop operative to output a third clock signal having a third frequency lower than said first frequency for distribution over a trace;
   a phase-locked loop operative to receive said third clock signal after said third clock signal is distributed over said trace and to output at least one clock signal having a fourth frequency higher than said third frequency;
   a first delay circuit operative to provide to said delay-locked loop a time delayed version of said third clock signal that is time-delayed by a first delay amount after said third clock signal is distributed over said trace; and
   a second delay circuit operative to receive said second clock signal and to output a fifth clock signal time delayed relative to said second clock signal by a second delay amount substantially equal to said first delay amount, wherein said delay-locked loop is operative to receive said fifth clock signal.

2. The clock signal distribution circuit of claim 1 wherein said trace comprises a signal wire.

3. The clock signal distribution circuit of claim 1 wherein said phase-locked loop comprises a voltage-controlled oscillator comprising at least one voltage-controlled delay unit operative to output said at least one clock signal having said fourth frequency.

4. The clock signal distribution circuit of claim 1 wherein said second frequency is substantially equal to said first frequency divided by $2^n$ where n is a positive integer.

5. The clock signal distribution circuit of claim 1 wherein said third frequency is substantially equal to said second frequency.

6. The clock signal distribution circuit of claim 1 wherein said fourth frequency is substantially equal to said first frequency.

7. The clock signal distribution circuit of claim 1 wherein said phase locked-loop is operative to output a plurality of clock signals having said fourth frequency, said plurality of clock signals having different phases.

8. A clock signal distribution circuit comprising:
   a clock generator operative to output a reference clock signal having a first frequency;
   a frequency divider operative to receive said reference clock signal and to output a second clock signal having a second frequency lower than said first frequency;
   a delay-locked loop coupled to said output of said frequency divider, said delay-locked loop operative to output a third clock signal having a third frequency lower than said first frequency for distribution over a trace;
   a phase-locked loop operative to receive said third clock signal after said third clock signal is distributed over said trace and to output at least one clock signal having a fourth frequency higher than said third frequency, said phase-locked loop comprising a voltage-controlled oscillator comprising at least one voltage-controlled delay unit operative to output said at least one clock signal having said fourth frequency;
   a second delay-locked loop operative to receive said first clock signal and to generate a fifth clock signal having a fifth frequency that is substantially equal to said first frequency, said second delay-locked loop comprising at least one voltage-controlled delay unit that is substantially identical to said at least one voltage-controlled delay unit of said phase-locked loop circuit, said second delay-locked loop operative to output a control voltage for controlling said at least one voltage-controlled delay unit of said second delay-locked loop circuit; and
   a logic circuit operative to receive said control voltage of said second delay-locked loop circuit and output said control voltage to an input of said at least one voltage-controlled delay unit of said phase-locked loop circuit.

9. A method of distributing a reference clock signal comprising:
   generating said reference clock signal having a first frequency;
   generating a second clock signal having a second frequency lower than said first frequency in response to said generating said reference clock signal;
   generating a third clock signal time delayed relative to said second signal by a first delay amount and having a third frequency that is about the same as said second frequency;
   distributing said third clock signal over a trace;
   feeding back said third clock signal after said third clock signal is distributed over said trace;
   delaying said third clock signal that is fed back after being distributed over said trace by a second delay amount substantially equal to said first delay amount; and
   generating a fourth clock signal having a fourth frequency higher than said second frequency after said distributing.

10. The method of claim 9 further comprising generating a voltage for use in said generating a fourth clock signal in response to said generating said reference clock signal.

11. The method of claim 9 further comprising generating a plurality of said fourth clock signals each having a fourth frequency higher than said second frequency after said distributing voltage, each of said plurality of fourth signals having a different phase.

12. The method of claim 9 wherein generating said fourth clock signal comprises generating said fourth clock signal in-phase with said reference clock signal.

13. The method of claim 9 wherein generating said fourth clock signal comprises generating said fourth clock signal having a predetermined phase difference relative to said reference clock signal.

14. A method of distributing a reference clock signal comprising:
   receiving said reference clock signal having a first frequency;
   generating a second clock signal having a second frequency lower than said first frequency in response to said receiving said reference clock signal;
   time delaying said second clock signal by a first delay amount;
   logking a third clock signal having the same frequency as said second clock signal onto said time delayed second clock signal;
   distributing said third clock signal over a trace;
   feeding back said third clock signal after said third clock signal is distributed over said trace;

time delaying said third clock signal that is fed back after being distributed over said trace by a second delay amount substantially equal to said first delay amount;

locking onto said time delayed third clock signal after said distributing; and generating a fourth clock signal having a third frequency substantially equal to said first frequency after said locking onto said third clock signal.

15. The method of claim 14 wherein said locking onto said time delayed second clock signal comprises determining the phase of said reference clock signal.

16. The method of claim 14 wherein said locking onto said time delayed third clock signal after said distributing comprises determining the phase and frequency of said time delayed third clock signal.

17. A method of distributing a reference clock signal having a first frequency, said method comprising:

generating a second clock signal having a second frequency lower than said first frequency;

time delaying said second clock signal by a first delay amount;

locking onto said reference clock signal;

locking a third clock signal having substantially the same frequency as said second clock signal, said third clock signal derived from said time-delayed second clock signal;

distributing said third clock signal over a trace;

feeding back said third clock signal after said third clock signal is distributed over said trace;

time delaying said third clock signal that is fed back after being distributed over said trace by a second delay amount substantially equal to said first delay amount;

locking onto said third frequency of said time delayed third clock signal after said distributing at substantially the same time as said locking onto said reference clock signal; and generating a fourth clock signal having a fourth frequency greater than said second frequency after said locking onto said third frequency of said time delayed third clock signal.

18. The method of claim 17 wherein said locking onto said reference clock signal comprises locking onto said reference clock signal using a control voltage and wherein said locking onto said third frequency of said time delayed third clock signal after said distributing comprises locking onto said third frequency using said control voltage.

19. The method of claim 17 further comprising locking onto a phase of said time delayed third clock signal, wherein said phase of said time delayed third clock signal is in-phase with a phase of said reference clock signal.

20. The method of claim 17 further comprising locking onto a phase of said time delayed third clock signal, wherein said phase of said third clock signal has a predetermined phase difference relative to a phase of said reference clock signal.

21. The method of claim 17 wherein said generating a fourth clock signal comprises generating a fourth clock signal having a frequency one half said first frequency.

22. A computer system comprising:

a processor;

a memory controller coupled to said processor; and a plurality of dynamic random access memory (DRAM) chips coupled to said memory controller, at least one of said DRAM chips comprising at least one digital circuit subsystem and clock distribution circuitry comprising:

first circuitry operative to receive a reference clock signal having a first frequency and to output a second clock signal having a second frequency lower than said first frequency and a phase delayed relative to said reference clock signal by a first delay amount, said first circuitry operative to distribute a third signal having about the same frequency as said second clock signal over a trace that extends along at least a portion of said at least one of said DRAM chips;

second circuitry operative to receive said third clock signal after said third clock signal has been distributed over said trace and to output a fourth clock signal having a fourth frequency higher than said second frequency for use by said at least one digital circuit subsystem; and a delay circuit operative to provide to said first circuitry a time delayed version of said third signal that is time delayed by a second delay substantially equal to said first delay after said third signal is distributed over said trace.

23. The system of claim 22 wherein said first circuitry comprises a delay-locked loop.

24. The system of claim 22 wherein said second circuitry comprises a phase-locked loop.

25. Apparatus for distributing a reference clock signal, said apparatus comprising:

means for generating said reference clock signal having a first frequency;

means for generating a second clock signal from said generated reference clock signal, said second clock signal having a second frequency lower than said first frequency;

means for generating a third clock signal time delayed relative to said second signal by a first delay amount and having a third frequency that is about the same as said second frequency;

means for distributing said third clock signal;

means for feeding back said third clock signal to said means for distributing said third clock signal after said third clock signal is distributed;

means for delaying said third clock signal that is fed back after being distributed over said trace by a second delay amount substantially equal to said first delay amount; and means for generating a fourth clock signal having a fourth frequency higher than said second frequency after said third clock signal is distributed by said means for distributing.

* * * * *

UNITED STATES PATENT AND TRADEMARK OFFICE
CERTIFICATE OF CORRECTION

PATENT NO. : 7,528,638 B2  Page 1 of 1
APPLICATION NO. : 10/744206
DATED : May 5, 2009
INVENTOR(S) : Seong-hoon Lee et al.

It is certified that error appears in the above-identified patent and that said Letters Patent is hereby corrected as shown below:

In column 8, line 62, in claim 14, delete "logking" and insert -- locking --, therefor.

Signed and Sealed this

Twenty-first Day of July, 2009

JOHN DOLL
*Acting Director of the United States Patent and Trademark Office*